United States Patent [19]

Miyauchi et al.

[11] Patent Number: 5,208,437
[45] Date of Patent: May 4, 1993

[54] METHOD OF CUTTING INTERCONNECTION PATTERN WITH LASER AND APPARATUS THEREOF

[75] Inventors: Tateoki Miyauchi; Mikio Hongo; Shigenobu Maruyama; Katsurou Mizukoshi, all of Yokohama; Hiroshi Yamaguchi, Fujisawa; Koyo Morita, Yamanashi, all of Japan

[73] Assignee: Hitachi, Ltd., Tokyo, Japan

[21] Appl. No.: 697,779

[22] Filed: May 9, 1991

[30] Foreign Application Priority Data

May 18, 1990 [JP] Japan .................. 2-126691

[51] Int. Cl.⁵ .......................... B23K 26/14
[52] U.S. Cl. .............. 219/121.67; 219/121.83
[58] Field of Search ............ 219/121.67, 121.72, 219/121.73, 121.83, 121.68, 121.69, 121.84

[56] References Cited

U.S. PATENT DOCUMENTS

| | | | |
|---|---|---|---|
| 3,584,183 | 6/1971 | Chiaretta | 219/121.69 |
| 4,179,310 | 12/1979 | Compton et al. | 219/121.6 X |
| 4,190,759 | 2/1980 | Hongo et al. | 219/121.85 |
| 4,240,094 | 12/1980 | Mader | 219/121.85 X |
| 4,818,835 | 4/1989 | Kuwabara et al. | 219/121.6 |
| 5,017,755 | 5/1991 | Yahagi et al. | 219/121.68 |

OTHER PUBLICATIONS

Hartmann, H. D., et al. "Investigations of Nd:YAG Laser Formed Connections and Disconnections of Standard CMOS Double Level Metallizations," Procs. 1990 Int. Conf. Wafer Scale Integration, pp. 298–307. (Provided in English).

Anthony E. Siegman, "Lasers", published by University Science Books, pp. 1041–1113. (Provided in English).

Edward J. Swenson, "Some Present and Future Applications of Laser Processing—An Overview", Solid State Technology, Nov. 1983, pp. 156–158. (Provided in English).

A. A. Bugaev, et al., "Generation of Small-Scale Structural Relief in a Silicon Surface by Picosecond Radiation Pulses", Sov. Tech. Phys. Lett. vol. 12, No. 6, Jun. 1986, pp. 292–293. (Provided in English).

Primary Examiner—C. L. Albritton
Attorney, Agent, or Firm—Fay, Sharpe, Beall, Fagan, Minnich & McKee

[57] ABSTRACT

In an interconnection film cutting method and apparatus therefor according to the present invention, a laser beam having a pulse width of $10^{-9}$ second or less is illuminated on a desired portion of the interconnection pattern of a semiconductor device, such as a link used for redundant operation of a defective bit in, for example, a LSI memory, or on a desired portion of the interconnection pattern of a large-scaled interconnection substrate through a transmission type liquid crystal mask in the form of a desired pattern so as to cut the interconnection pattern without damaging a layer disposed below the interconnection pattern.

21 Claims, 5 Drawing Sheets

METHOD OF CUTTING INTERCONNECTION PATTERN WITH LASER AND APPARATUS THEREOF

BACKGROUND OF THE INVENTION

The present invention relates to laser cutting of interconnecting material. More particularly, the present invention pertains to a method of and an apparatus for cutting an interconnection pattern with a laser which enables laser cutting to be carried out to change interconnection of a semiconductor device or a large-scale interconnection substrate without damaging the vicinity of a cut portion.

The techniques of cutting an LSI interconnection pattern with a laser, which are the redundancy techniques, have been described in IEEE Journal of Solid-State Circuits, vol, SC-16, No. 5, Oct. 1981, from page 506 to 513. Cutting of Al interconnection in an LSI has been described in Annals of the CIRP Vol. 28/1, 1979, from page 113 to 116.

In the above-described conventional techniques, the effective range of the laser power with which cutting can be performed without giving damage is narrow, and deviation of the laser beam from the interconnection to be cut easily occurs, generating damage.

SUMMARY OF THE INVENTION

An object of the present invention is to provide a method of and an apparatus for cutting an interconnection pattern with a laser which allows the interconnection pattern cutting process to be carried out in a semiconductor device or a large-scale interconnection substrate over a wide laser power output range without damaging a lower substrate or a lower interconnection film.

Another object of the present invention is to provide a method of and an apparatus for cutting an interconnection pattern with a laser which is capable of processing the interconnection pattern of an IC device or a large-scale interconnection substrate with a laser over a wide laser power output range by projecting a desired pattern aligned to the width of the interconnection pattern.

To achieve these objectives, the present invention provides a method of cutting an interconnection pattern of an IC device or of a large-scale multi-layer interconnection substrate with a laser without damaging a lower layer by irradiating a laser beam having a pulse width of $10^{-9}$ sec or less on a desired portion on the interconnection pattern. The large-scale multi-layer interconnection substrate comprises a thin-film multi-layer substrate.

The present invention further provides a laser processing apparatus which comprises a laser light source for outputting a high power laser beam having a pulse width of $10^{-9}$ sec or less, and a projecting optical system for shaping the laser beam output from the laser light source into a desired pattern and for projecting the desired pattern on a workpiece.

The projecting optical system in the laser processing apparatus has a transmission type liquid crystal mask.

The laser processing apparatus further comprises an imaging/displaying means for imaging and displaying an image of the projected pattern and an image of the workpiece.

According to the present invention, the width of the pulse of the laser light source is reduced to a value smaller than that at which removal occurs, and the laser beam is shaped by the liquid crystal projecting mask to a width of the interconnection pattern to be processed. Consequently, an accurate irradiation is possible, and cutting can be done over a wide power range without causing damage.

In the cutting of the interconnection pattern by a laser, it takes 1 ns or longer for the heat phenomenon to occur. Hence, the present inventors came to the conclusion that, when the interconnection cutting process is performed by illuminating a high power laser beam having a pulse width of 1 ns or less on a desired portion of the interconnection pattern of a semiconductor device or of a large-scale multi-layer interconnection substrate, entering of laser pulses into the interconnection pattern which has been melted away does not occur. That is, when a laser beam having a pulse width is illuminated at a high power output level to process cutting, the interconnection material is present while the laser pulses continue (which is 1 ns or less), and all the laser energy is thus received by the interconnection material. Consequently, in the IC device or large-scale multi-layer interconnection substrate, a Si substrate or a thin film interconnection film laid below an insulating film made of a material having a low coefficient of thermal expansion, such as $SiO_2$, is not exposed to the laser beam, thus eliminating generation of damage thereto. The peak power P required for the cutting process is substantially in inverse proportion to the square root of the pulse width S, and is related to the pulse width S in the manner described below.

$$P = K\sqrt{\frac{S_0}{S}} P_0$$

where $P_0$ and $S_0$ are respectively the original peak power and the original pulse width, and K is the proportional constant.

When the pulse width is reduced from about 100 ns, which is the conventional width, to about 100 ps to 300 ps, which is used in the present invention, the peak power must be increased by a factor of 10 to 20. However, as the required energy E is equal to the product of the peak power and the pulse width, i.e., E=P.S, in the case where K is substantially equal to 1, the energy E is in proportion to the square root of the pulse width and hence can be reduced to a value which is one order in magnitude smaller than the conventional value. Since all such laser energy is received by the interconnection material, the interconnection pattern can be cut without damaging the lower layer.

This is shown in FIG. 4. The boiling point of aluminum is about 2270° C. In a case where a laser beam having a pulse width of 1 ns or less is irradiated on the surface of the interconnection pattern made of, for example, aluminum, energy absorption occurs in a very short period of time of about $10^{-15}$ sec. It takes about 1 ns for the laser energy to be transformed into heat within the interconnection pattern made of aluminum or the like. Therefore, in the case of a laser beam having a pulse width of 1 ns or less, even when the laser beam is illuminated at a high level, illumination of the laser pulse is completed before a change on the interconnection pattern due to the heat phenomenon occurs, and no laser beam enters the portion where the interconnection pattern has been removed. Consequently, a desired portion of the interconnection pattern can be cut without the layer disposed below the interconnection pattern being damaged.

Furthermore, since the laser beam can be accurately matched to a dimension (width) of the desired portion of the interconnection pattern using a liquid crystal projection mask or the like, illumination of the laser beam on the portion located outside the interconnection pattern can be eliminated, and accurate removal can thus be performed without damaging the vicinity or the lower layer.

DETAILED DESCRIPTION OF THE PREFERRED EMBODIMENT

Figure 1:
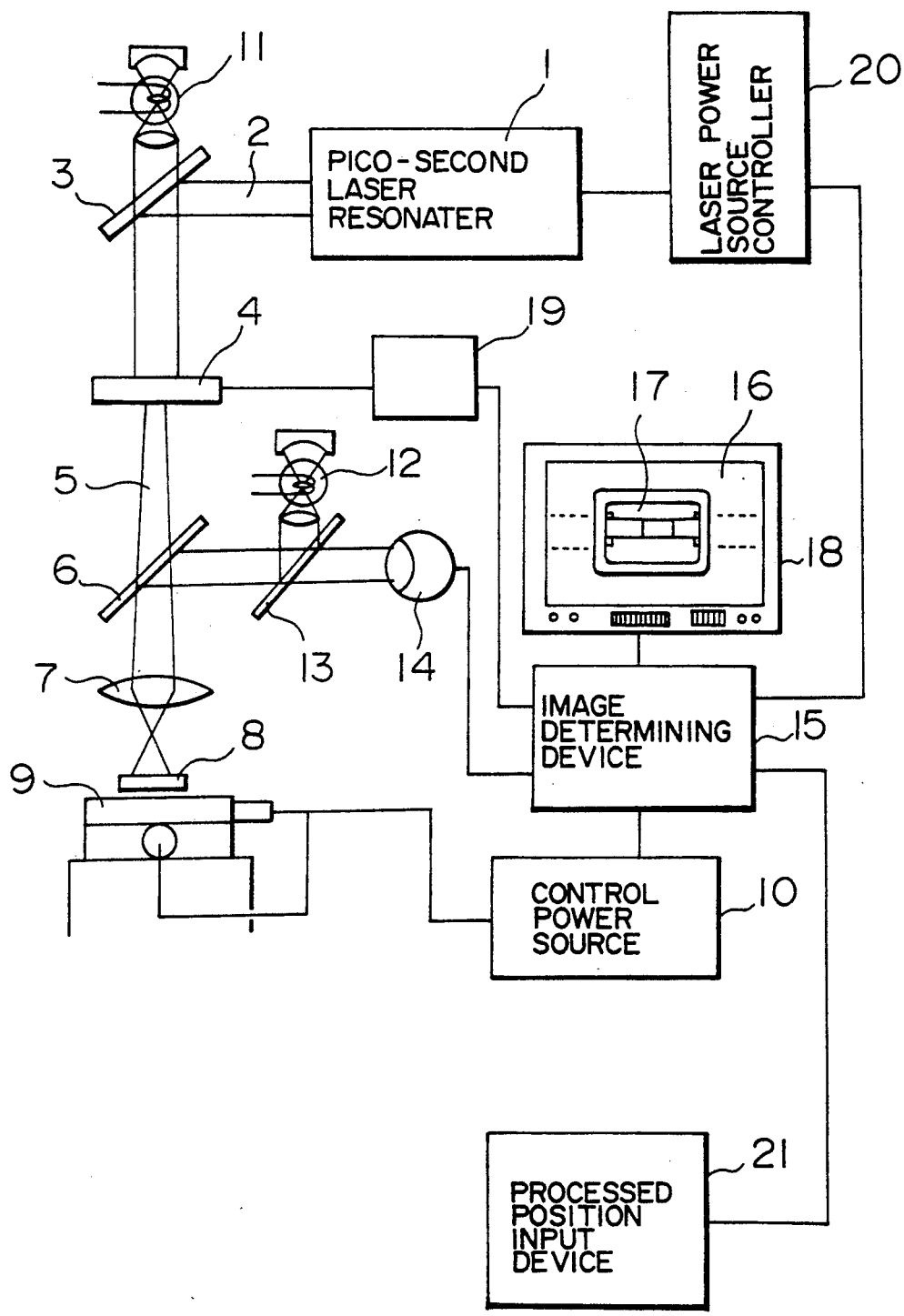
FIG. 1 shows an embodiment of a laser processing apparatus according to the present invention.

An embodiment of the present invention will now be described with reference to FIG. 1.

A laser beam 2 emitted from a pico-second laser 1 ("LASERS" published by University Science Books and written by Anthony E. Siegman, pp. 1041-1131), which outputs a laser beam having a pulse width of 1 ns or less (which is 100 to 300 ps) and several mjouls, is refracted by a reflection mirror 3 by 90 degrees, and is then led to a transmission type liquid crystal mask 4. A light 5 which has passed through a light-transmission pattern of the liquid crystal mask 4 passes through a half mirror 6 for observation and a projection lens 7, and is then projected to the surface of a workpiece 8, such as a semiconductor device or a large-scale multi-layer substrate, as a liquid crystal pattern to illuminate it. The workpiece 8 is placed on an XY table 9, which is automatically operated by a table control power source 10. The liquid crystal mask 4 is illuminated by a projection pattern illuminating lamp 11, and the workpiece 8 is illuminated by an object illuminating lamp 12 through a half mirror 13. Behind the half mirror 13 is disposed an imaging device 14 which may be a camera tube or a solid state imaging device. The imaging device 14 provides an image of the portion of the workpiece 8 to be processed. The obtained image enters an image determining device 15 which pattern recognizes the portion of the image to be illuminated with a laser beam, which displays on a TV monitor 18 both an image 16 obtained by the pattern recognition and an area 17 to be illuminated with a laser beam, and which sends to a liquid crystal pattern controller 19 the signal representing the area 17 to generate the transmission pattern of the liquid crystal mask 4 corresponding to the area 17 to be illuminated with the laser beam in such a manner that the transmission pattern is accurately aligned with a desired portion of the interconnection pattern (link) on the semiconductor device or the large-scale multi-layer substrate 8. Once it is confirmed by the imaging device 14 and the image determining device 15 that the liquid crystal mask pattern indicates the area to be illuminated with the laser beam and that the pattern is accurately projected onto the desired portion of the interconnection pattern by the projected pattern illumination lamp, a laser illumination signal is sent from the image determining device 15 to a laser power source controller 20 which controls the laser. Thus, only the required portion of the workpiece is illuminated with a laser beam accurately.

The image determining device 15 is connected to a processed position inputting device 21 which supplies information representing a plurality of positions to be illuminated with the laser beam to the image determining device 15. Consequently, a plurality of portions can be processed with a laser in one operation, and the speed for the redundancy process of the defective LSI memory bits can thus be increased greatly.

Figure 2A:
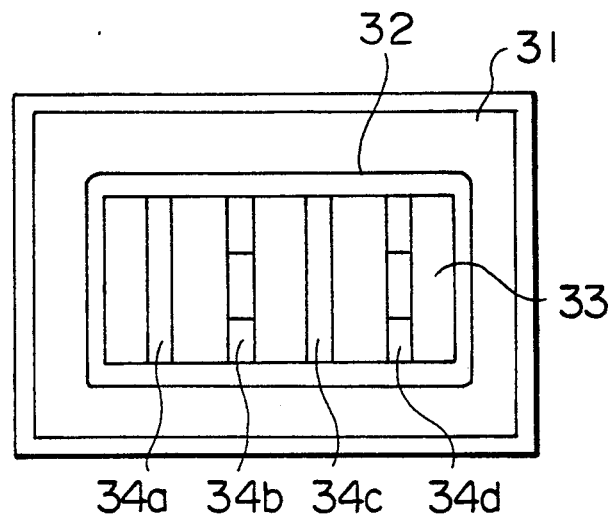
FIGS. 2A to 2C show a projection pattern generated when the apparatus of FIG. 1 is applied to the redundant operation of defective bits of a semiconductor memory IC as well as the results of cutting of an interconnection pattern.
Figure 2B:
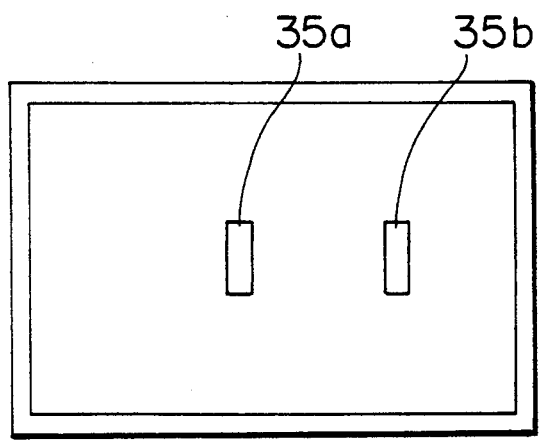
Figure 2C:
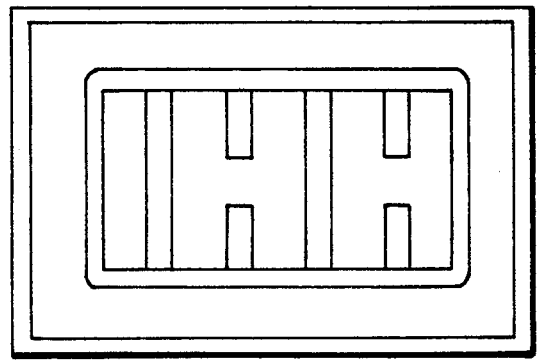
Figure 3A:
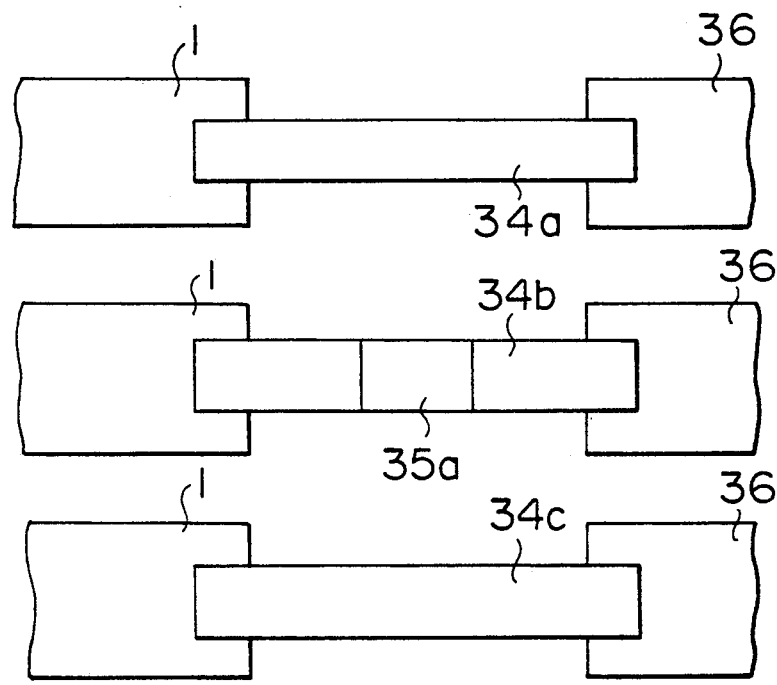
FIGS. 3A and 3B are respectively plan and cross-sectional views of links used in the redundant operation of defective bits of the semiconductor memory IC.
Figure 3B:
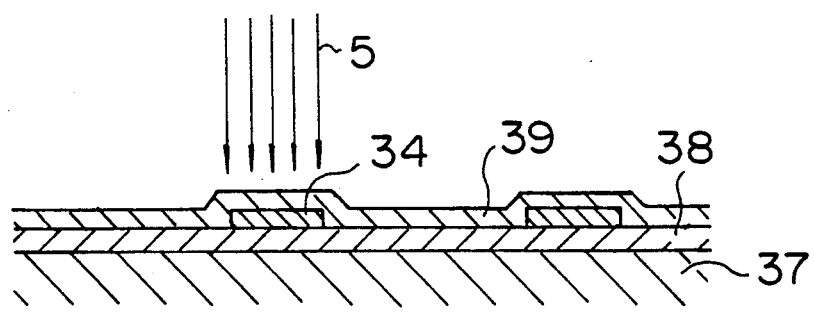
Figure 4:
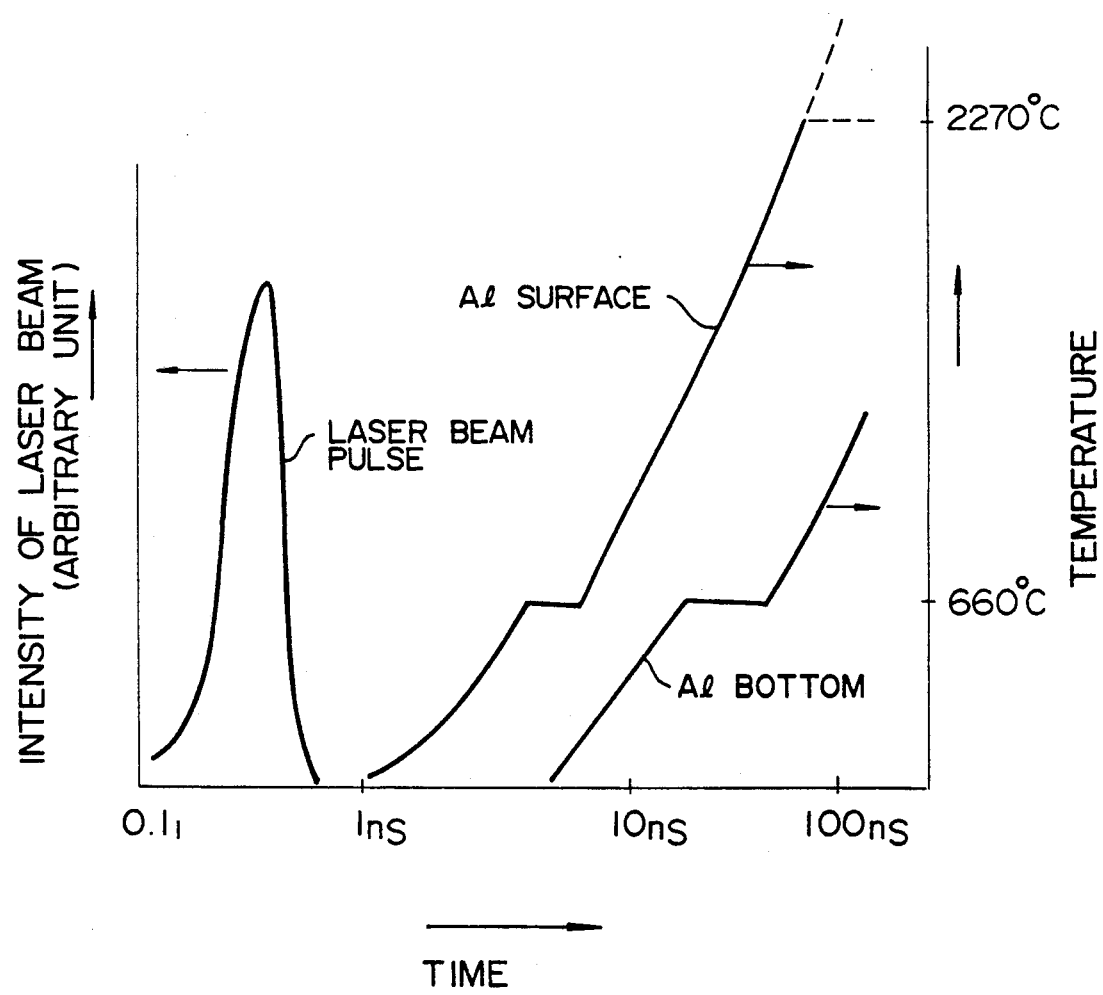
FIG. 4 shows the action of the present invention.

FIG. 2A shows an example of a displayed image of the workpiece. FIG. 2B shows an example of the pattern of the liquid crystal mask. An image 32 of the workpiece, corresponding to the area of the liquid crystal mask, has redundant links which can be exchanged for the faulty bits of a LSI memory, as shown in FIGS. 3A and 3B. The image 32 contains four redundant links 34a to 34d made of, for example, polysilicon or the like and surrounded by a guard ring 33 into which impurities are doped. Among these links, the links 34b and 34d are shown as the links to be disconnected according to the information supplied from the image determining device 21. The pattern of the liquid crystal mask shown in FIG. 2B has only areas 35a and 35b as the area through which a laser beam is passed. FIG. 2C shows a state in which the redundant links have been processed by the laser beam illuminated according to the pattern shown in FIG. 2B. Thus, a plurality of links can be accurately processed in one operation.

In fabrication of, for example, a large-capacity semiconductor memory IC, it is very difficult to increase the yield thereof because many thousands of functional devices are incorporated on a single chip whose one side is a few millimeters. Hence, it has been proposed to incorporate spare memory cells in a chip which can be switched in to replace defective memory cells. This replacement is usually accomplished using a replacing interconnection pattern. This interconnection pattern is opened by means of a laser to disconnect the faulty memory cells and to transfer the previous identity of the faulty memory cells to the spare memory cells. That is, the redundancy process of the defective bits in large-capacity LSI memory ICs is conducted in the manner shown in FIGS. 3A and 3B which are respectively plan and cross-sectional views of a memory IC. More specifically, a pico-second laser beam is irradiated on a replacing interconnection pattern 34, made of, for example, polysilicon, and connected to an Al interconnection pattern 36, at an output power of about $10^6$ to $10^9$ w/cm$^2$ so as to remove a desired portion of the replacing interconnection pattern 34, which is necessary to achieve connection of the spare memory cells. At that time, the laser beam is projected as a pattern substantially to a width of the replacing interconnection pattern. The replacing interconnection pattern 34 is formed on an insulating oxide film SiO$_2$ 38 laid on a substrate Si 37. The replacing interconnection pattern 34 is made of polysilicon, aluminum or metal silicide. A SiO$_2$ film (protective film) 39 is coated on the replacing interconnection pattern 34. In this embodiment, as all the laser energy is received by the replacing interconnection pattern 34, a desired portion 35 of the replacing interconnection pattern 34 can be removed without the substrate 37 being exposed to the laser beam. The substrate 37 made of, for example, Si is present below the insulating film 38 made of, for example, $SiO_2$, and having a low coefficient of thermal conductivity. It is therefore possible to prevent occurrence of damage to the substrate 37 made of, for example, Si.

Although the redundant process of the defective bits in the LSI memory has been described, the present invention can also be applied to semiconductor devices having a thin-film multi-layer structure or large-scale multi-layer substrates. That is, according to the present invention, it is possible to cut an upper thin film interconnection pattern without damaging a lower thin film interconnection pattern.

Figure 5:
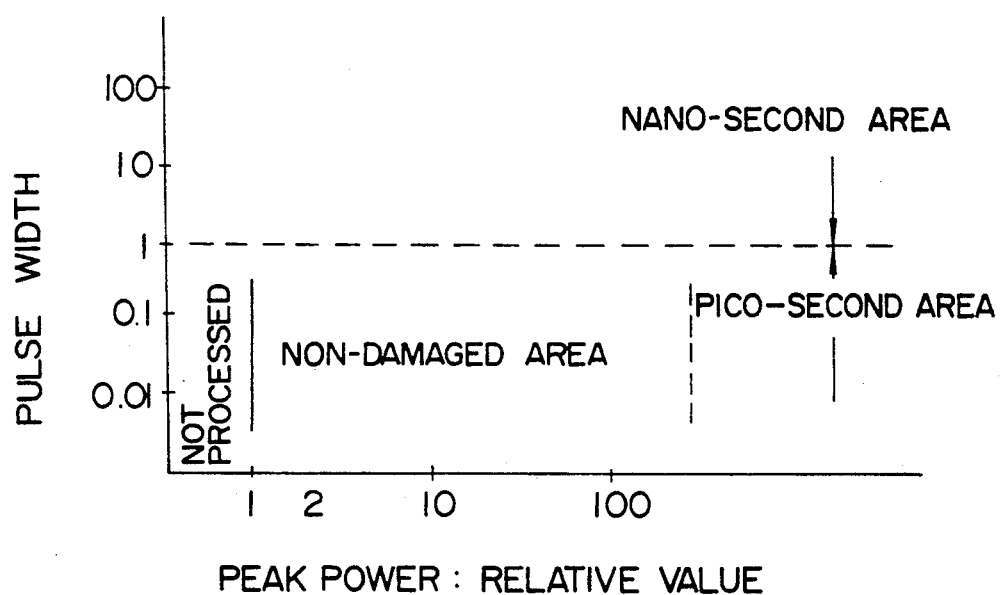
FIG. 5 shows the effect of the present invention.

As will be understood from the foregoing description, it is possible according to the present invention to readily cut an interconnection pattern with a laser beam without damaging a lower film (shown in FIG. 5).

Furthermore, since the present invention employs the liquid crystal projection to achieve self-alignment, accurate laser illumination is made possible. Therefore, illumination of the portion which is not the link to be cut with the laser beam is eliminated.

Furthermore, since the number of portions to be processed in one operation is not limited to one in the present invention, processing efficiency can be greatly increased.

Furthermore, as the present invention employs a liquid crystal mask whose pattern can be changed electrically, masking can be processed at a high speed and successively.

What is claimed is:

1. A method of cutting an interconnection pattern with a laser, the method comprising steps of:
   providing a laser beam of a single pulse having a pulse width of $10^{-9}$ seconds or less and an energy density of substantially $10^6$ w/cm$^2$ or more, the pulse width permitting optical energy absorbed by said interconnection pattern to be converted into thermal energy to begin melting said interconnection pattern when said laser beam is incident upon said interconnection pattern;
   shaping said laser beam to assume a desired configuration corresponding to substantially a width of said interconnection pattern;
   coordinating said laser beam upon a desired portion or portions of said interconnection pattern; and,
   projecting the laser beam upon said desired portion or portions of said interconnection pattern so that optical energy of said laser beam of the single pulse is absorbed by said desired portion or portions of said interconnection pattern to be converted into thermal energy to permit said desired portion or portions of said interconnection pattern to melt and evaporate for cutting of the interconnection pattern without damaging a layer below said interconnection pattern through direct irradiation of laser beam is accomplished.

2. The method of cutting an interconnection pattern according to claim 1, wherein the upper limit of said energy density is substantially $10^9$ w/cm$^2$ or less.

3. The method of cutting an interconnection pattern according to claim 2, wherein pattern projection is conducted using a projection mask.

4. The method of cutting an interconnection pattern according to claim 3, wherein a pattern generated in the projection mask is self-aligned with an area to be illuminated with the laser beam which is obtained as an image of the interconnection pattern.

5. A method of cutting a desired portion or portions of links on semiconductor devices with a laser, the method comprising steps of:
   providing a laser beam of a single pulse having a pulse width of $10^{-9}$ seconds or less and an energy density of substantially $10^6$ w/cm$^2$ or more, the pulse width permitting optical energy absorbed by said links to be converted into thermal energy to begin melting said links when said laser beam is incident upon said links;
   shaping said laser beam to assume a desired configuration corresponding to substantially a width of said links;
   coordinating said laser beam upon said desired portion or portions of said links; and,
   projecting the laser beam upon said desired portion or portions of said links so that optical energy of said laser beam of the single pulse is absorbed by said desired portion or portions of said links to be converted into thermal energy to permit said desired portion or portions of said links to melt and evaporate for cutting of the links without damaging a layer below said links through direct irradiation of laser beam.

6. The method of cutting according to claim 5, wherein the links are used in a redundant process for a defective bit of a LSI memory.

7. The method of cutting according to claim 6, wherein the layer below comprises a substrate of the LSI memory, which is made of Si.

8. The method of cutting according to claim 5, wherein said laser beam is projected in a pattern having a desired form so that it can be illuminated substantially to the width of the links.

9. A method of cutting a desired portion or portions of wiring on a high-density multi-layer wiring board with a laser comprising steps of:
   providing a laser beam of a single pulse having a pulse width of $10^{-9}$ seconds or less and an energy density of substantially $10^6$ w/cm$^2$ or more, the pulse width permitting optical energy absorbed by said wiring to be converted into thermal energy to begin melting said wiring when said laser beam is incident upon said wiring;
   shaping the laser beam to assume a desired configuration corresponding to substantially a width of said wiring;
   coordinating said laser beam upon said desired portion or portions of said wiring; and,
   projecting the laser beam upon said desired portion or portions of said wiring so that optical energy of said laser beam of the single pulse is absorbed by said desired portion or portions of said wiring to be converted into thermal energy to permit said desired portion or portions of said wiring to melt and evaporate for cutting of the wiring without damaging a layer below said wiring through direct irradiation of laser beam.

10. The method of cutting according to claim 9, wherein said high density multi-layer wiring board comprises a thin film multi-layer substrate.

11. The method of cutting according to claim 9, wherein said laser beam is projected in a pattern having a desired form so that it can be illuminated substantially to the width of the wiring.

12. An apparatus for cutting an interconnection pattern, comprising:

a laser beam source for emitting a high-output laser beam of a single pulse having a pulse width of $10^{-9}$ seconds or less, the pulse width permitting optical energy absorbed by said interconnection pattern to be converted into thermal energy to begin melting said interconnection pattern when said laser beam is incident upon said interconnection pattern; and, a projection optical system for projecting said laser beam of the single pulse, which is output from said laser beam source and shaped to assume a desired configuration corresponding to substantially a width of said interconnection pattern and having an energy density of substantially $10^6$ w/cm$^2$ or more, so as to have a same coordinate with and irradiate upon a desired portion or portions of said interconnection pattern whereby optical energy of said laser beam of the single pulse irradiated from said projection optical system is absorbed by said desired portion or portions of said interconnection pattern to be converted into thermal energy to have said desired portion or portions melt and evaporate for cutting of the interconnection pattern without damaging a layer formed below the interconnection pattern through direct irradiation of laser beam.

13. The apparatus for cutting an interconnection pattern according to claim 12, wherein said projection optical system has a transmission type liquid crystal mask.

14. The apparatus according to claim 12, further comprising an imaging/displaying means for imaging and displaying an image of a projection pattern and an image of said desired portion or portions of the interconnection pattern, and control means for controlling said projection optical system such that said image of the projection pattern displayed on said imaging/displaying means coordinates with said image of said desired portion or portions of said interconnection pattern.

15. A laser processing apparatus, comprising:

a laser beam source for emitting a high-output laser beam of a single pulse having a pulse width of $10^{-9}$ seconds or less, the pulse width permitting optical energy absorbed by a workpiece to be converted into thermal energy to begin melting said workpiece when said laser beam is incident upon said workpiece; and, a projection optical system for projecting said laser beam of the single pulse, which is output from said laser beam source and shaped to assume a desired configuration corresponding to substantially a desired area or areas of the workpiece being worked and have an energy density of substantially $10^6$ w/cm$^2$ or more, so as to have a same coordinate with and irradiate upon a desired area or areas of said workpiece whereby optical energy of said laser beam of the single pulse irradiated from said projection optical system is absorbed by said desired area or areas of said workpiece to be converted into thermal energy to have said desired area or areas melt and evaporate for processing without damaging a portion or portions below said area or areas through direct irradiation of said laser beam.

16. The laser processing apparatus according to claim 15, wherein said projection optical system has a transmission type liquid crystal mask.

17. The laser processing apparatus according to claim 15, further comprising an imaging/displaying means for imaging and displaying an image of a projection pattern and an image of said desired area or areas, and control means for controlling said projection optical system such that said image of the projection pattern displayed on said imaging/displaying means coordinates with said image of the desired area or areas.

18. The apparatus for cutting an interconnection pattern according to claim 13, further comprising an imaging/displaying means for imaging and displaying an image of a projection pattern and an image of said desired portion or portions of the interconnection pattern, and control means for controlling said projection optical system such that said image of the projection pattern displayed on said imaging/displaying means coordinates with said image of said desired portion or portions of said interconnection pattern.

19. A laser processing apparatus according to claim 16, further comprising an imaging/displaying means for imaging and displaying an image of the projection pattern and an image of said desired area or areas, and control means for controlling said projection optical system such that said image of the projection pattern displayed on said imaging/displaying means coordinates with said image of the desired area or areas.

20. A method of cutting a portion of an interconnection pattern disposed on a semiconductor layer using a system including a laser beam source and an imaging/displaying means, the method comprising steps of:

aligning the portion of the interconnection pattern with the laser beam source using the imaging/displaying means;

generating, by the laser beam source, a laser beam having a pulse width of substantially $10^{-9}$ seconds or less and an energy density of substantially $10^6$ w/cm$^2$ and shaped to correspond to the interconnection pattern;

directly irradiating the portion with the laser beam to supply the portion with sufficient energy through the irradiating to facilitate melting and evaporation of the portion and, terminating irradiation prior to the melting and the evaporation.

21. An apparatus for cutting a portion of an interconnection pattern disposed on a semiconductor layer, the apparatus comprising:

a laser beam source for generating a laser beam having a pulse width of substantially $10^{-9}$ seconds or less and an energy density of substantially $10^6$ w/cm$^2$ and shaped to correspond to the interconnection pattern;

means for aligning the portion of the interconnection pattern with the laser beam source;

means for directly irradiating the portion with the laser beam to supply the portion with sufficient energy to facilitate melting and evaporation of the portion; and, means for terminating the irradiating prior to the melting and the evaporation.

* * * * *